(12) United States Patent
Plössl (10) Patent No.: US 9,634,155 B2
(45) Date of Patent: Apr. 25, 2017

(54) METHOD FOR PRODUCING AN ELECTRICAL TERMINAL SUPPORT

(75) Inventor: Andreas Plössl, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 114 days.

(21) Appl. No.: 13/996,492

(22) PCT Filed: Dec. 16, 2011

(86) PCT No.: PCT/EP2011/073136
§ 371 (c)(1),
(2), (4) Date: Sep. 13, 2013

(87) PCT Pub. No.: WO2012/084743
PCT Pub. Date: Jun. 28, 2012

(65) Prior Publication Data
US 2013/0341655 A1    Dec. 26, 2013

(30) Foreign Application Priority Data
Dec. 23, 2010  (DE) .................. 10 2010 056 056

(51) Int. Cl.
*H01L 31/02* (2006.01)
*H01L 33/62* (2010.01)
(Continued)

(52) U.S. Cl.
CPC ...... *H01L 31/02002* (2013.01); *H01L 23/147* (2013.01); *H01L 23/49827* (2013.01);
(Continued)

(58) Field of Classification Search
CPC ......... H01L 23/49827; H01L 31/02002; H01L 33/62; H01L 33/382; H01L 23/481;
(Continued)

(56) References Cited

U.S. PATENT DOCUMENTS 7,714,345 B2    5/2010  Negley
2002/0135069 A1    9/2002  Wood et al.
(Continued)

FOREIGN PATENT DOCUMENTS

CN          1851948 A      10/2006
DE    102008021402 A1     11/2009
(Continued)

OTHER PUBLICATIONS

B. Cui et al., "Filing of nano-via holes by laser-assisted direct imprint", Microelectronic Engineering, vol. 83, 2006, pp. 1547-1550.
(Continued)

*Primary Examiner* — Jerome Jackson, Jr.
*Assistant Examiner* — David Spalla
(74) *Attorney, Agent, or Firm* — McDermott Will & Emery LLP (57) ABSTRACT

The invention relates to a method for producing an electrical terminal support for an optoelectronic semiconductor body, comprising the following steps: providing a carrier assembly (1), which comprises a carrier body (11), an intermediate layer (12) arranged on an outer surface (111) of the carrier body (11), and a use layer (13) arranged on the intermediate layer (12); introducing at least two openings (4), which are mutually spaced in the lateral direction (L), in the use layer (13) via an outer surface (131) of the use layer (13), wherein the openings extend completely through the use layer (13) in the vertical direction (V); electrically insulating lateral surfaces (41) of the openings (4) and of the outer face (131) of the use layer (13); arranging electrically conductive material (6) at least in the openings (4), wherein after completion of the terminal carrier (100), the electrically conductive material (6) has an interruption (U) in the progression thereof
(Continued)

along the outer surface (131) of the use layer (13) in the lateral direction (L) between adjoining openings (4).

12 Claims, 5 Drawing Sheets

(51) Int. Cl.
- *H01L 23/498* (2006.01)
- *H01L 23/14* (2006.01)
- *H01L 33/00* (2010.01)
- *H01L 33/38* (2010.01)

(52) U.S. Cl.
CPC ........ *H01L 31/02005* (2013.01); *H01L 33/62* (2013.01); *H01L 33/0079* (2013.01); *H01L 33/382* (2013.01); *H01L 2924/0002* (2013.01); *Y10T 29/49165* (2015.01)

(58) Field of Classification Search
CPC ............... H01L 23/5384; H01L 21/486; H01L 21/76877; H01L 21/02625
USPC .......... 438/106, 637; 257/99, 621, 698, 773, 257/774; 49/106, 637
See application file for complete search history.

(56) References Cited

U.S. PATENT DOCUMENTS

| | | |
|---|---|---|
| 2006/0105496 A1 | 5/2006 | Chen et al. |
| 2007/0045780 A1 | 3/2007 | Akram et al. |
| 2007/0080414 A1 | 4/2007 | Bjorkman et al. |
| 2007/0272939 A1 | 11/2007 | Peng |
| 2008/0272497 A1 | 11/2008 | Lake |
| 2009/0065800 A1* | 3/2009 | Wirth ............. H01L 31/022408 257/100 |
| 2009/0294983 A1* | 12/2009 | Cobbley ........... H01L 21/76898 257/774 |
| 2010/0078770 A1* | 4/2010 | Purushothaman .. H01L 21/6835 257/621 |
| 2010/0187694 A1 | 7/2010 | Yu et al. |
| 2010/0237471 A1* | 9/2010 | Pagaila ................. H01L 21/486 257/621 |
| 2011/0079917 A1* | 4/2011 | Xia ....................... H01L 21/486 257/774 |
| 2011/0121425 A1* | 5/2011 | Yannou et al. ............... 257/516 |
| 2011/0260205 A1* | 10/2011 | Moosburger et al. .......... 257/99 |
| 2012/0129337 A1* | 5/2012 | Chen et al. ................... 438/636 |
| 2012/0267773 A1* | 10/2012 | Ebefors ................... B81B 7/007 257/692 |

FOREIGN PATENT DOCUMENTS

| | | |
|---|---|---|
| DE | 10 2009 022 966 A1 | 12/2010 |
| TW | 201029232 A | 8/2010 |
| WO | 2010/059118 A1 | 5/2010 |

OTHER PUBLICATIONS

S.K. Bhattacharya et al., "A low temperature processable ternary gallium alloy for via filing application in microelectronic packaging", Journal of Material Science: Materials in Electronics 11, 2000, pp. 653-656.

Okmetic: "Okmetic BSOI Wafers for MEMS" advertising material of company Okmetic, 2002, 2 pages.

Y.K. Jee et al., "Zinc and Tin-Zinc Via-Filling for the Formation of Through-Silicon Vias in a System-in-Package", Journal of Electronic Materials, vol. 38, No. 5, 2009, pp. 685-690.

A. Ploessl et al., "Silicon-on-insulator: materials aspects and applications", Solid-State Electronics, vol. 44, 2000, pp. 775-782.

T. Suemasu et al., "High Aspect Ratio Through-hole Interconnections in Silicon Substrates", Fujikura Technical Review, 2003, pp. 40-44.

* cited by examiner

METHOD FOR PRODUCING AN ELECTRICAL TERMINAL SUPPORT

A method for producing an electrical terminal support, a method for producing an optoelectronic semiconductor component, an electrical terminal support and an optoelectronic semiconductor component are specified.

One object to be achieved consists in specifying a method for producing an electrical terminal support for an optoelectronic semiconductor body wherein material damage to the terminal support produced is avoided.

In accordance with at least one embodiment of the method, a first step involves providing a support arrangement. The support arrangement can be a mechanically stable support, on the outer surfaces of which, for example, component parts can be arranged and fixed. In other words, the support arrangement is self-supporting and constitutes a stable mounting and/or support basis for the component parts. The support arrangement can be embodied in the manner of a wafer. Preferably, an extent of the support arrangement in a lateral direction is large relative to an extent of the support arrangement in a vertical direction. That is to say that the extent of the support arrangement in a lateral direction is, for example, at least five times greater than the extent of the support arrangement in a vertical direction. In this context, "lateral direction" means a direction parallel to the main extension direction of the support arrangement. "Vertical direction" is a direction perpendicular to the main extension direction of the support arrangement, that is to say for example the thickness of the support arrangement. The support arrangement has a support body, wherein an intermediate layer is arranged on an outer surface of the support body. Furthermore, a utility layer is arranged onto an outer surface of the intermediate layer facing away from the support body. In this context, "utility layer" means that at least this layer remains in the finished electrical terminal support and performs an electrical and/or mechanical function for example when the electrical terminal support is incorporated in an optoelectronic component.

Preferably, the material of the intermediate layer is different than the material of the utility layer. In this case, the material of the utility layer is not identical to the material of the intermediate layer. By way of example, the intermediate layer is electrically insulating. The utility layer and the intermediate layer can differ from one another at least in terms of their chemical and/or physical properties.

In accordance with at least one embodiment of the method, a next step involves introducing at least two openings arranged in a manner spaced apart from one another in a lateral direction into the utility layer via an outer surface of the utility layer facing away from the carrier body, wherein the openings extend completely through the utility layer in a vertical direction. For example, the openings are introduced into the utility layer by means of at least one dry- and/or wet-chemical etching process. By way of example, the intermediate layer is substantially not etchable in comparison with the utility layer using the same etchant. In this context, "substantially not etchable" means that the intermediate layer has, using an etchant, an etching rate which is at most 20%, preferably less than 10%, of an etching rate of the utility layer, using the same etchant. In other words, in this case, during etching the utility layer is etched through and the etching process is stopped on account of the material properties and the associated low or absent etching rate in the intermediate layer. In this case, the intermediate layer is an etching stop layer. In other words, introducing openings into the utility layer in this way is associated with an etching process of high etching selectivity between the utility layer and the intermediate layer. Alternatively or additionally, the etching process in the intermediate layer can also be interrupted or terminated by means of an etching end point identification. In particular, this can be utility in the event of the utility layer and the intermediate layer having similar or identical etching rates, since the etching process in this case does not necessarily stop automatically within the intermediate layer, but rather has to be interrupted or terminated in an externally predefinable manner. For this purpose, by way of example, a decay of an (etching) signal correlated with the utility layer and/or the etching process or an increase of an (etching) signal associated with the intermediate layer and/or the etching process could be used to interrupt and/or stop the etching process in a timely manner.

For example, each opening has at least one continuous and associated side surface and also a bottom surface and an opening situated opposite the bottom surface. The bottom surface can be formed completely by the intermediate layer, wherein the side surface is formed by the utility layer at least in places.

In accordance with at least one embodiment, a next step involves electrically insulating side surfaces of the openings and the outer surface of the utility layer facing away from the support body. That is to say that no electric current can be carried directly on the side surfaces of the openings and the outer surface of the utility layer facing away from the support body.

In accordance with at least one embodiment of the method, a next step involves arranging electrically conductive material at least in places in the openings, wherein after the terminal support has been completed, the electrically conductive material has at least one interruption in its course along the outer surface of the utility layer in the lateral direction between adjacent openings. In other words, openings which are adjacent in a lateral direction are not continuously connected to one another by the electrically conductive material. For example, the openings are completely filled with the electrically conductive material. By way of example, the interruption insulates from one another electrically conductive material arranged in the openings in a manner adjacent from one another in a lateral direction.

In accordance with at least one embodiment of the method, a first step involves providing a support arrangement having a support body, an intermediate layer arranged on an outer surface of the support body, and a utility layer arranged on an outer surface of the intermediate layer facing away from the support body. A next step involves introducing at least two openings arranged in a manner spaced apart from one another in a lateral direction into the utility layer via an outer surface of the utility layer facing away from the support body, wherein the openings extend completely through the utility layer in a vertical direction. A further step involves electrically insulating side surfaces of the openings and the outer surface of the utility layer facing away from the support body. Furthermore, a next step involves arranging electrically conductive material at least in places in the openings, wherein after the terminal support has been completed, the electrically conductive material has at least one interruption in its course along the outer surface of the utility layer in the lateral direction between adjacent openings.

In this case, the method for producing an electrical terminal support as described here is based, inter alia, on the insight that introducing openings into a support body which can serve for later making electrical contact with an optoelectronic component can be associated with damage on or in the support body. If the openings are introduced into the support by means of an etching process, for example, such an etching process can lead to material damage in the support body in particular in the region of bottom surfaces of the openings. Since such a support body can remain part of the later optoelectronic component, the optoelectronic component likewise has such damage on its support body. By way of example, this can lead to an optoelectronic component whose optical output power and/or loading capacity during operation is reduced.

In order, then, to specify a method for producing an electrical terminal support in which such material damage in the support body is avoided, the method described here makes use of the concept, inter alia, of arranging on a support body firstly an intermediate layer and a utility layer onto said intermediate layer. In other words, the intermediate layer is arranged between the utility layer and the support body. The intermediate layer can therefore be a buffer and/or spacer between the support body and the utility layer.

If the openings are then introduced into the utility layer by means of an etching method, for example, the intermediate layer can act as an etching stop which stops the etching process. In other words, the intermediate layer acts as the etching termination (also blind hole termination), such that possible damage for example in the region of the bottom surfaces of the openings which can be caused by the etching termination can be caused by the etching process only in the intermediate layer instead of in the utility layer. In other words, damage in the utility layer is avoided. In order, for example, to make it possible to incorporate the utility layer in a later optoelectronic component, a next step involves electrically insulating side surfaces of the openings and an outer surface of the utility layer facing away from the support body. A semiconductor body of the later optoelectronic semiconductor component can then be applied on the outer surface, wherein electrical contact is made with the semiconductor body by means of the electrically conductive material arranged in the openings.

In accordance with at least one embodiment of the method, the process of electrically insulating is carried out by means of at least one thermal oxidation method. By means of such a method, the side surfaces of the openings and the outer surface of the utility layer facing away from the support body can be electrically insulated particularly simply and cost-effectively. By way of example, the side surfaces of the openings and the outer surface are heated for this purpose, such that, by way of example, the material of the utility layer is surface-oxidized.

In accordance with at least one embodiment of the method, the process of electrically insulating is carried out by means of a coating method, wherein deposited layers are formed from at least one of the following materials AlN, $Al_2O_3$, $SiO_2$, $Si_3N_4$, SrO, HfO, $HfO_2$, ZrO, $ZrO_2$ or contain at least one of the materials. In particular, the electrically insulating layers can be applied for example by chemical vapor deposition (CVD) and/or atomic layer deposition (ALD).

In accordance with at least one embodiment, the support body is formed with a silicon and the intermediate layer is formed with an oxide of the silicon and/or a nitride of the silicon. For example, such a support body is described in the document "Silicon-on-insulator: materials aspects and applications, Andreas Plössl, Gertrud Kräuter, Solid-State Electronics layer 44 (2000) 775-782", the disclosure content of which is hereby incorporated by reference.

In accordance with at least one embodiment, the intermediate layer is formed with at least one of the following materials $SiO_2$, $Si_3N_4$, SrO, HfO, $HfO_2$, ZrO, $ZrO_2$ or contains at least one of these materials.

In accordance with at least one embodiment of the method, the utility layer is formed with at least one of the materials Si, AlN, GaN, Ge, GaAs or contains at least one of the materials. By way of example, the utility layer and the support body are formed with the same material, for example Si. In this case, such a support arrangement is particularly cost-effective. If the utility layer is formed with GaN, the intermediate layer and/or the support body can be formed with Si for example. Advantageously, GaN and Si have coefficients of thermal expansion matched to one another, such that within the support arrangement, for example during heating of the support arrangement, tensile and/or compressive strains that are as low as possible occur within the support arrangement.

Sapphire is likewise appropriate instead of the Si as material for the support body and/or the intermediate layer. For example, the intermediate layer can likewise be formed with one or more partial layers each formed for example with one of the following materials: $SiO_2$, $Si_3N_4$, SrO, HfO, $HfO_2$, ZrO, $ZrO_2$. In this case, a further intermediate layer, formed for example with $SiO_2$, can be arranged on the intermediate layer. If the utility layer is formed with Ge, for example, appropriate material for the support body and/or the intermediate layer can include Ge, GaAs or sapphire. In this case, it is possible for the process of electrically insulating the side surfaces to be effected for example by means of depositing at least one electrically insulating layer at least onto the side surfaces of the utility layer, instead of by means of thermal oxidation.

In accordance with at least one embodiment of the method, the electrically conductive material is introduced in the form of a melt into the openings and subsequently cured, wherein the electrically conductive material is formed with at least one of the materials Al, Zn, Cu, Ag, Si, Cd, Ga, In, Tl, Sn, Pb, Bi, Po or contains at least one of the materials. By way of example, such introduction of electrically conductive material into the openings is described for the case of Zn in the document "Zinc and Tin-Zinc Via Filling for the Formation of Through-Silicon Vias in a System-in-Package, Journal of ELECTRONIC MATERIALS, Vol. 38, No. 5, 2009", the disclosure content of which is hereby incorporated by reference. If the electrically conductive material is formed with a semiconductor material, the latter can be doped. The electrically conductive material can likewise be alloys and/or electrically conductive metal pastes. If the electrically conductive material is present in the form of a metal paste, the curing of the metal paste can be effected isothermally.

In accordance with at least one embodiment of the method, the electrically conductive material is introduced in the form of a melt into the openings and subsequently cured, wherein the electrically conductive material comprises at least one binary eutectic system. By way of example, the binary eutectic material comprises alloys such as, for example: AuSn, AuSi, AuGe, AuSb, AlGe and AlZn.

Desired physical and/or technical properties of the electrically conductive material are a high electrical and thermal conductivity, matching to the thermal expansion properties of the utility layer as precisely as possible, and also adhesion to the utility layer as well as possible. Further criteria for the selection of the corresponding material can be viscosity, surface tension, reactivity or susceptibility to oxidation of the electrically conductive material.

If the utility layer is incorporated together with the electrically conductive material in a semiconductor component, an electrical and thermal conductivity that is as high as possible can result in the avoidance of energy losses in the current feeding within the semiconductor component and in dissipation of power loss from the semiconductor component as effectively as possible.

The table below compares the individual physical and/or technical properties of zinc and aluminum:

|  | Aluminum | Zinc |
|---|---|---|
| Melting point [° C.] | 660.4 | 419.6 |
| Viscosity [mPa s] | 1.2 | 3.5 |
| Surface energy [$J/m^2$] | 1.07 | 0.8 |
| Electrical resistivity [$\mu\Omega$ cm] | 2.7 | 6.0 |
| Thermal Conductivity [W/m K] | 235 | 120 |
| Coefficient of linear thermal expansion [$10^{-6}$ $K^{-1}$] | 23.1 | 30.2 |

By way of example, Cu and Ag have a high electrical and thermal conductivity. If the electrically conductive material is formed with Zn, Si, Cd, Ga, In, Tl, Sn, Pb, Bi, Po, AuSn, the electrically conductive material has a low melting point, as a result of which the utility layer is (heat)-damaged as little as possible during the filling of the openings, for example. On the other hand, the melting points are high enough, however, such that when the utility layer is incorporated in a later semiconductor component, for example during a soldering process, the electrically conductive material does not melt.

In accordance with at least one embodiment of the method, the electrically conductive material is introduced in the form of a melt into the openings, wherein the insulation layer in the region of the openings is additionally wetted by a metal layer. As a result of the wetting of the insulation layer with the metal layer, the wetting properties for the electrically conductive material on the insulation layer can be configured differently and improved.

The metal layer can be selected with regard to its wetting by the filling material. It is possible to use physical or chemical vapor deposition methods such as sputtering, vaporization and ALD (Atomic Layer Deposition) for applying the metal layer, wherein, in particular, the vapor deposition methods can be employed in combination with a photolithographic patterning method.

Possible materials for forming the metal layer are, in particular, Ni or Nb, wherein a multilayered combination such Ti/Ni/Au, Cr/Pt/Au, Ti/TiN/Ni/Pd/Au or TaN/Pt/Au can also be used for coating the insulation layer, wherein the layer sequence of the metal layers can deviate from the examples mentioned above. By way of example, in the multilayer variant, each individual layer can perform a specific function. By way of example, Ti or Cr is suitable for promoting adhesion with respect to the substrate, Ni, Pd or Pt is suitable for a wetting function, and Au is suitable for a readily wettable covering which is intended to prevent or at least reduce the oxidation or contamination of the lower metal layer in the case of the multilayered combination. In the case of AuSn melt for filling the openings, Ti/Pt/Au, in particular, would be an advantageous layer sequence for forming the metal layer.

In accordance with at least one embodiment, the electrically conductive material is an electrically conductive adhesive. By way of example, the adhesive is formed with a matrix material, into which metal particles or other electrically conductive particles are introduced, wherein the matrix material can cure after being filled into the openings.

In accordance with at least one embodiment of the method, after curing, the electrically conductive material projects beyond the utility layer in a vertical direction. That is to say that the electrically conductive material projects from the utility layer in a vertical direction and is raised above the utility layer. In this case, the openings can be overfilled with the electrically conductive material and the excess electrically conductive material emerging from the openings can be in direct contact with the outer surface of the utility layer facing away from the support body.

Alternatively, the openings can also be only partly filled with the electrically conductive material. In other words, the openings are under filled in this case. That is to say that the utility layer projects beyond the electrically conductive material in a vertical direction. Such an under filling can be avoided or eliminated by a vertical extent of the utility layer and/or of the intermediate layer being chosen to be correspondingly small, or by the utility layer and/or the intermediate layer being drawn back to the level of the electrically conductive material by means of a selective etching process.

In accordance with at least one embodiment, in a next step, at least one polishing stop layer is applied at least in places to the outer surface of the utility layer facing away from the support body, wherein outer surfaces of the electrically conductive material facing away from the support body are free of the polishing stop layer at least in places and the polishing stop layer is formed with at least one of the materials $SiO_2$, $Si_3N_4$, SrO, HfO, $HfO_2$, ZrO, $ZrO_2$ or contains at least one of the materials. By way of example, the polishing stop layer is applied only to the exposed outer surface of the utility layer, wherein the polishing stop layer completely borders and can enclose the electrically conductive material in a plan view of the outer surface of the utility layer.

By way of example, after the polishing stop layer has been applied on the outer surface of the utility layer, the electrically conductive material likewise projects beyond the polishing stop layer in a vertical direction. In other words, in this case, too, the electrically conductive material projects from the polishing stop layer in a vertical direction. It is likewise possible that, prior to producing the openings in the utility layer and/or prior to arranging the electrically conductive material, the polishing stop layer is applied, at least in places, to the outer surface of the utility layer facing away from the support body. In this context, "polishing stop layer" means that, with the use of a chemical and/or mechanical polishing step, the polishing stop layer can be removed and/or polished significantly more poorly, or not at all, in comparison with the electrically conductive material. By way of example, after the use of the polishing step, only the electrically conductive material has traces of a material removal.

Furthermore, the polishing stop layer on the basis of materials mentioned above can also function as an electrical insulation layer. In other words, the polishing stop layer then performs a double function. That is to say that it has an electrically insulating effect and stops the chemical and/or mechanical polishing step, wherein the intention is to prevent mechanical damage primarily particularly at the edges of the outer surface of the utility layer facing away from the support body. In this case, the application of an additional polishing stop layer only constitutes a further protection for the outer surface of the utility layer facing away from the support body with respect to the already existing insulation layer or polishing stop layer. Therefore, if the polishing stop layer fulfills the double function, it is possible to refrain from applying a further polishing stop layer.

In accordance with at least one embodiment, after applying at least one polishing step at least to the electrically conductive material, the electrically conductive material does not project beyond the polishing stop layer in a vertical direction. By way of example, in this case, the electrically conductive material together with an outer surface of the polishing stop layer facing away from the support body forms a planar surface. Advantageously, in the case where a semiconductor body is later applied to the polishing stop layer and to the electrically conductive material, it is possible to avoid problems in respect of electrically and/or mechanically connecting the semiconductor body to the electrically conductive material.

In accordance with at least one embodiment, after arranging the electrically conductive material, the support body is removed from the intermediate layer. By way of example, the removal of the support body takes place by means of high-energy laser light being radiated onto the intermediate layer, for example, which is at least partly destroyed by the laser light (also called laser lift-off). It is likewise conceivable for the support body to be removed by, at least in places, etching and/or mechanical grinding of the intermediate layer and/or of the support body itself. It is additionally conceivable for possible residues of the intermediate layer that still remain after the removal of the support body also to be removed from the utility layer by means of further polishing. After the removal of the support body and, if appropriate, of the intermediate layer, in the finished terminal support only the utility layer remains as a support material of the electrical terminal support.

In accordance with at least one embodiment, the removal of the support body from the intermediate layer prior to making contact with the optoelectronic semiconductor body is dispensed with. That is to say that the optoelectronic semiconductor body can be combined with the support arrangement before the support body has been removed from the utility layer and after the electrically conductive material fills the openings and a continuous contact between electrically conductive material and optoelectronic semiconductor body can be formed at least in places. In particular, it is also possible to attach the optoelectronic semiconductor body only after the application of the terminal support via an outer surface of the utility layer facing the contact support (contact surface) onto a component support.

In accordance with at least one embodiment, after arranging the electrically conductive material, the support body is removed from the intermediate layer. If etching is effected at least partly into the intermediate layer in addition to the utility layer, for example, in order to introduce the openings spaced apart laterally with respect to one another into the terminal support, then the remaining intermediate layer can contribute to the edge insulation at that side of the utility layer which faces the support body. In this case, the support body is once again removed by means of laser lift-off methods, wherein the support body is formed from a material accessible to the laser lift-off method and can be supplemented in particular by a subsequent dry- or wet-chemical etching process in order to remove possible residues of the intermediate layer. Alternatively, the support body and the intermediate layer are removed in planar fashion by mechanical grinding, for example, wherein a subsequent dry- or wet-chemical etching process can be used for removing possible residues of the intermediate layer and/or of the support body until the electrically conductive material is exposed and forms an interface with the remaining intermediate layer. It is also possible for the support body and the intermediate layer to be removed only by etching, wherein no combination with other material-removing processes takes place. The interface that forms can be used, in particular, as a terminal area with respect to a component support and/or contact support.

In accordance with at least one embodiment, the electrical terminal support comprises the terminal area, wherein a contact layer is formed on the terminal area. By way of example, in this case the contact layer can extend over a large part of the terminal area. In the present context, "large part" means that the contact layer covers the terminal area with an area coverage of at least 50%, in particular at least 75%, wherein in particular insulation regions, for example in the form of an insulation gap, separates the contact layer into areas or regions formed in an electrically insulating fashion with respect to one another. In this case, the insulation regions comprise an insulating material, in particular. In this case, the contact layer can be formed for example on a hexagonal or rectangular terminal area of an optoelectronic component, wherein the contact layer can be formed symmetrically and/or asymmetrically for example by separation with the insulation gap.

Furthermore, a method for producing an optoelectronic semiconductor component is specified.

In accordance with at least one embodiment of the method, a first step involves providing an electrical terminal support produced by a method as described in or more of the embodiments described here. That is to say that the features implemented for the method for producing the electrical terminal support as described here are also disclosed for the method for producing the optoelectronic semiconductor component as described here, and vice versa.

In accordance with at least one embodiment of the method, a further step involves arranging on the outer surface of the utility layer at least one semiconductor body comprising at least one active zone suitable for generating or for detecting electromagnetic radiation, wherein the semiconductor body is electrically conductively connected to the electrically conductive material. By way of example, a semiconductor body is assigned at least in each case two openings which are arranged adjacent in a lateral direction and in which the electrically conductive material is arranged. In this case, the semiconductor body can have electrical contact locations which are electrically conductively connected to the outer surfaces of the electrically conductive material facing away from the support body.

In accordance with at least one embodiment of the method, a further step involves arranging on the outer surface of the utility layer at least one semiconductor body comprising at least one active zone suitable for generating or for detecting electromagnetic radiation, wherein the active zone is penetrated by a further electrically conductive material. The penetration forms an interface in particular with the underside of the optoelectronic semiconductor body electrically conductively and connects for example an n-conducting region of the optoelectronic semiconductor body to the electrically conductive material of the terminal support.

In accordance with at least one embodiment, the semiconductor body is based on a III nitride semiconductor material. In the present context, "III-nitride semiconductor material" means that the semiconductor body comprises or consists of a nitride semiconductor material, preferably $Al_nGa_mIn_{1-n-m}N$, wherein $0 \leq m \leq 1$, $0 \leq n \leq 1$ and $m+n \leq 1$.

In accordance with at least one embodiment, the semiconductor body is based on a III phosphide semiconductor material. In the present context, "III phosphide semiconductor material" means that the semiconductor body comprises a phosphide semiconductor material, preferably $Al_nGa_m$ $In_{1-n-m}P$ or $As_nGa_mIn_{1-n-m}P$, wherein $0 \leq n \leq 1$, $0 \leq m \leq 1$ and $n+m \leq 1$. In this case, this material need not necessarily have a mathematically exact composition according to the above formula. Rather, it can comprise one or more dopants and additional constituents. For the sake of simplicity, however, the above formula includes only the essential constituents of the crystal lattice (Al, Ga, In or N, P, As, Sb), even if these can be replaced in part by small amounts of further substances. The semiconductor body consists, in particular, of AlGaInP, AlGaInN or AlGaInAs or of a combination, such as, for example, of stacks of III-P and III-AS based partial cells.

In accordance with at least one embodiment of the method, the further electrically conductive material penetrates through the active zone of the optoelectronic semiconductor body and a doped region of the optoelectronic semiconductor body is electrically conductively connected to the electrically conductive material of the electrical terminal support. In this case, the further electrically conductive material penetrates through the optoelectronic semiconductor body in such a way that the further electrically conductive material forms a further interface with the underside of the optoelectronic semiconductor body, penetrates through the active region and is connected to the doped region. In this case, the doped region can be an n-conducting or p-conducting region of the optoelectronic semiconductor body, wherein, for example, the n-conducting region is separated from the p-conducting region by the active zone. The further interface that forms is in direct contact in particular with the electrically conductive material of the electrical terminal support. In other words, the further electrical conductive material of the optoelectronic semiconductor body forms, with the electrically conductive material of the electrical terminal support, a continuous electrical connection. The further electrically conductive material can in this case have the same composition as the electrically conductive material.

In accordance with at least one embodiment, at least one protective diode structure is formed in the utility layer, and is electrically interconnected with the semiconductor body. By way of example, the protective diode structure is integrated into the utility layer. For example, the outer surface of the utility layer facing away from the support body together with an outer surface of the protective diode structure facing away from the support body then forms a planar surface. In other words, the protective diode structure does not project from the utility layer in a vertical direction in this case.

In accordance with at least one embodiment, at least one protective diode structure is formed in the utility layer, and is electrically interconnected with the semiconductor body. By way of example, the protective diode structure is integrated into the utility layer; in this case, the outer surface of the utility layer facing the support body together with an outer surface of the protective diode structure facing the support body can form a planar surface. For this purpose, it is necessary that, prior to forming the utility layer on the outer surface of the intermediate layer facing away from the support body, the protective diode structure is formed in the outer surface of the utility layer facing the support body. In other words, the protective diode structure forms at least in places an interface between utility layer and intermediate layer, wherein the protective diode structure does not project from the utility layer in an opposite vertical direction. By means of the protective diode structure, the semiconductor body is protected against electrostatic discharge. An electrical voltage which arises, for example on account of electrostatic charging, and which is present in a reverse direction relative to a forward direction of the active zone can flow away via the protective diode structure. Damage to the semiconductor body in the later optoelectronic component is thus avoided.

Furthermore, an electrical terminal support is specified.

By way of example, the electrical terminal support can be produced by means of the method described here, as described in conjunction with one or more of the embodiments mentioned above. That is to say that the features implemented for the method described here are also disclosed for the electrical terminal support described here, and vice versa.

In accordance with at least one embodiment, the electrical terminal support comprises at least one utility layer having an outer surface and a contact surface situated opposite the outer surface. The contact surface is part of the outer surface content of the utility layer, wherein the contact surface faces a contact support—for example a printed circuit board—in the mounted state of the electrical terminal support. In other words, the contact surface is a mounting surface which can serve for mounting the electrical terminal support onto the contact support. For example, the contact surface is formed in places by the electrically conductive material. In this case, the outer surface of the utility layer and the contact surface are connected to one another via side surfaces of the terminal support. By way of example, the side surfaces of the terminal support run in a vertical direction, that is to say perpendicularly or transversely with respect to the main extension direction of the electrical terminal support.

In accordance with at least one embodiment, the electrical terminal support comprises at least two openings arranged in a manner spaced apart from one another in a lateral direction in the utility layer, which are introduced into the utility layer via the outer surface of the utility layer.

In accordance with at least one embodiment, the electrical terminal support comprises electrically conductive material arranged at least in places in the openings, wherein the openings extend completely through the utility layer proceeding from the outer surface in the direction of the contact surface.

Side surfaces of the openings and the outer surface of the utility layer are embodied in an electrically insulating fashion, wherein the electrically conductive material has at least one interruption in its course along the outer surface between openings that are adjacent in a lateral direction.

Furthermore, an optoelectronic semiconductor component is specified.

By way of example, the optoelectronic semiconductor component can be produced by means of the method described here, as described in conjunction with one or more of the embodiments mentioned above. That is to say that the features implemented for the method described here are also disclosed for the optoelectronic semiconductor component described here, and vice versa.

In accordance with at least one embodiment, the optoelectronic semiconductor component comprises a terminal support as described in the embodiment described above. That is to say that the features implemented for the electrical terminal support are also disclosed for the optoelectronic semiconductor component described here, and vice versa.

In accordance with at least one embodiment, the optoelectronic semiconductor component comprises at least one optoelectronic semiconductor body arranged on the outer surface of the utility layer, wherein the optoelectronic semiconductor body comprises at least one active zone suitable for generating or for detecting electromagnetic radiation.

In accordance with at least one embodiment, the optoelectronic semiconductor component comprises at least one protective diode structure which is formed in the utility layer and which is electrically interconnected with the semiconductor body.

The method described here and an electrical terminal support described here and an optoelectronic semiconductor component described here are explained in greater detail below on the basis of exemplary embodiments and the associated figures.

FIGS. 1A, 1B, 1C, 1D, 1E and 1F show individual manufacturing steps for producing an exemplary embodiment of an optoelectronic semiconductor component described here by means of a method described here, wherein FIG. 1F shows, in a schematic side view, an exemplary embodiment of an optoelectronic semiconductor component described here comprising an exemplary embodiment of an electrical terminal support described here.

In the exemplary embodiments and the figures, identical or identically active constituent parts are in each case provided with the same reference signs. The elements illustrated should not be regarded as true to scale; rather, individual elements may be illustrated with an exaggerated size in order to afford a better understanding.

Figure 1A:
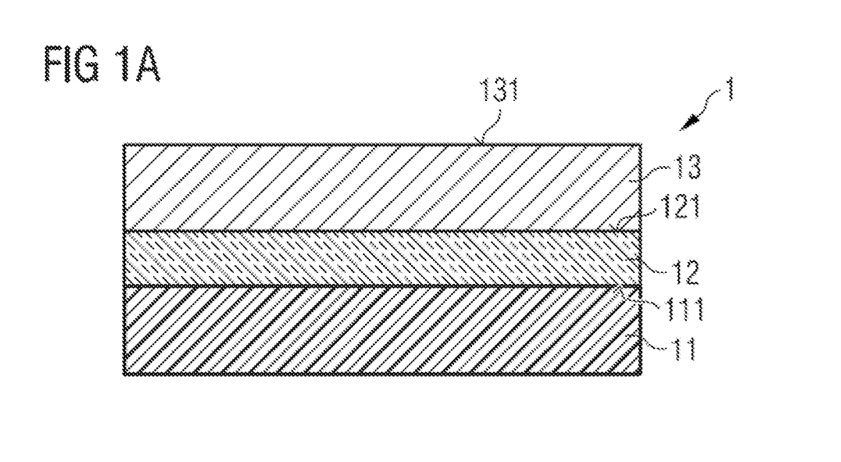

FIG. 1A shows a support arrangement 1 in a schematic side view. The support arrangement 1 has a support body 11, an intermediate layer 12 arranged on an outer surface 111 of the support body 11, and a utility layer 13 arranged on an outer surface 121 of the intermediate layer 12 facing away from the support body 11. In particular, the support body 11 can be formed with a silicon and the intermediate layer can be formed with an oxide of the silicon and/or a nitride of the silicon. The utility layer 13 is formed with at least one of the materials Si, N, GaN, Ge, GaAs or contains at least one of the materials. By way of example, the utility layer 13 has a thickness of at least 30 μm to at most 250 μm, preferably at least 50 μm to at most 200 μm. In this context, "thickness" means a maximum extent of the utility layer 13 in a vertical direction V.

Figure 1B:
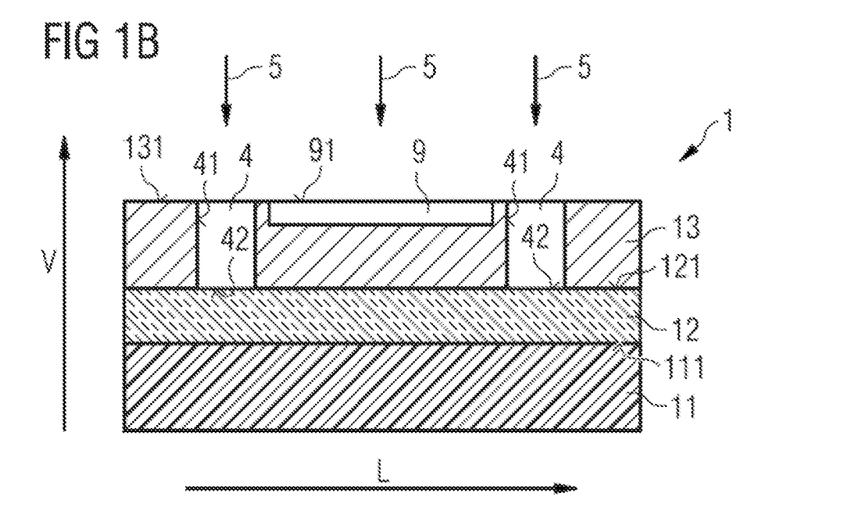

Furthermore, it can be discerned in FIG. 1B in a schematic side view of the support arrangement 1 that openings 4 arranged in a manner spaced apart from one another in a lateral direction L are introduced into the utility layer 13 via an outer surface 131 of the utility layer 13 facing away from the support 11, wherein side surfaces 41 of the openings 4 are completely formed by the utility layer 13. In this case, the openings 4 are introduced in the utility layer 13 by means of at least one dry- and/or wet-chemical etching process, for example. In other words, etching is effected in a vertical direction V through the utility layer 13 during etching, wherein the etching process ends in the intermediate layer 12 and/or is stopped by the material of the intermediate layer 12. That is to say that the intermediate layer 12 is substantially not etchable in comparison with the utility layer 13 using the same etchant. Bottom surfaces 42 of the openings 4 are formed completely by the intermediate layer 12.

It is furthermore shown in FIG. 1B that a protective diode structure 9 is formed in the utility layer 13. In this case, the outer surface 131 and an outer surface 91 of the protective diode structure 9 form a planar surface.

Moreover, FIG. 1B shows a thermal oxidation method 5, by means of which at least the side surfaces 41 and the outer surface 131 of the utility layer 13 facing away from the support body 11 are electrically insulated. In other words, directly on the oxidized locations of the outer surface 131 and the side surfaces 41 of the openings 4, no electric current will flow or be conducted along.

Figure 1C:
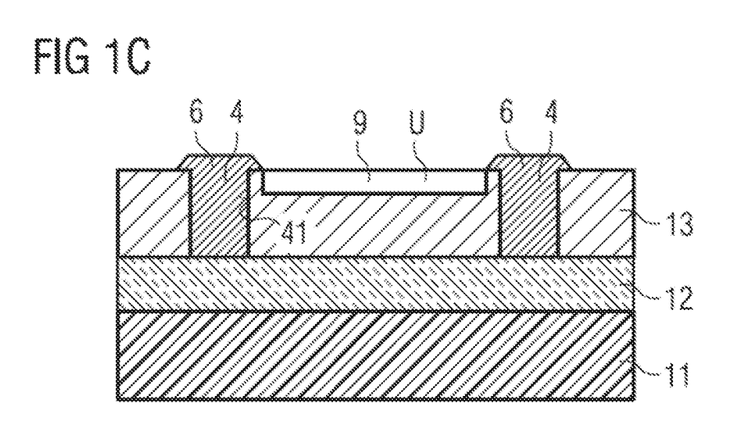

FIG. 1C illustrates in a schematic side view how, in a next step, electrically conductive material 6 is introduced, for example filled, into the openings 4, wherein the openings 4 are overfilled with the electrically conductive material 6. That is to say that the electrically conductive material 6 completely fills the openings and projects beyond the utility layer 13 in a vertical direction V. For this purpose, the electrically conductive material 6 is introduced for example in the form of a melt or by means of an electrolytic process into the openings 4. After being introduced into the openings 4, the electrically conductive material 6 can cure in the openings 4. By way of example, an under filling of the openings 4 after and/or during curing and/or cooling of the electrically conductive material 6 in the openings 4 may be caused by a volume contradiction of the electrically conductive material 6.

If an attempt is made to eliminate the under filling by thinning the utility layer 13, an electrical insulation at an upper edge of the utility layer 13 can incur damage, which can lead to an operating and/or safety risk in the case of the utility layer 13 being incorporated in a semiconductor component. Overfilling and subsequent removal, for example, protects said edge and, for example, barrier and/or insulation layers 21 applied to the outer surface 131 of the utility layer 13. Such barrier and insulation layers 21 can be applied, for example, by means of chemical vapor deposition (CVD) and/or atomic layer deposition (ALD). The intermediate layer 12 likewise allows opening and/or electrical terminal shaping of the electrically conductive material 6 by locally exposing and/or opening the electrically conductive material 6, without jeopardizing an edge insulation of the openings 4. For example, the electrically conductive material 6 is formed with at least one of the materials Al, Zn, Cu, Ag, Si, Cd, Ga, In, Tl, Sn, Pb, Bi, Po or contains at least one of the materials. Besides the materials enumerated above for the electrically conductive material, the electrically conductive material can comprise, in particular, binary eutectic systems, such as, for example, AuSn, AuSi, AuGe, AuSb, AlGe and AlZn. Furthermore, it can be gathered from FIG. 1C that the electrically conductive material 6 has an interruption U in its course along the outer surface 131 of the utility layer 13 in the lateral direction L. That is to say that no electrically conductive connection is produced between the openings 4 and the electrically conductive material 6 arranged in the openings 4. In other words, the electrically conductive material 6 arranged in the openings 4 is electrically insulated from one another.

Figure 1D:
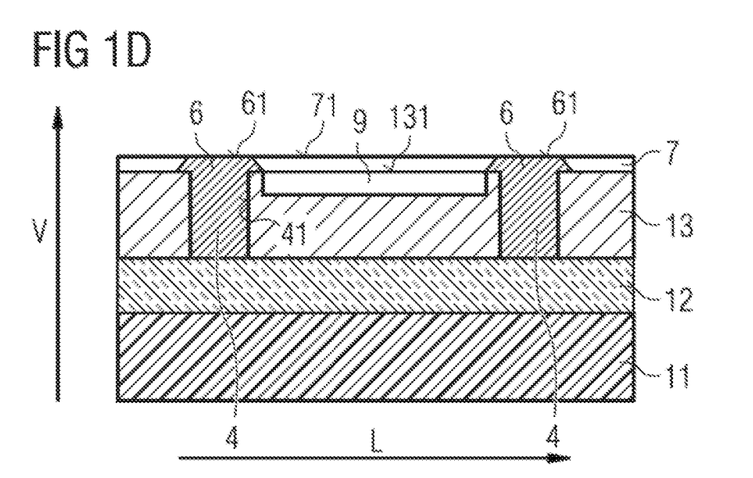

FIG. 1D illustrates a schematic side view of how, in a next step, a polishing stop layer 7 is applied to the outer surface 131, wherein outer surfaces 61 of the electrically conductive material 6 facing away from the support body 11 are free of the polishing stop layer 7 in places. In this case, in FIG. 1D, a polishing step has already been applied to the electrically conductive material 6, such that an outer surface 71 of the polishing stop layer 7 facing away from the support body 11 and the outer surfaces 61 of the electrically conductive material 6 form a planar surface. The polishing stop layer is formed with at least one of the materials $SiO_2$, $Si_3N_4$, SrO, HfO, $HfO_2$, ZrO, $ZrO_2$ or contains at least one of the materials.

Figure 1E:
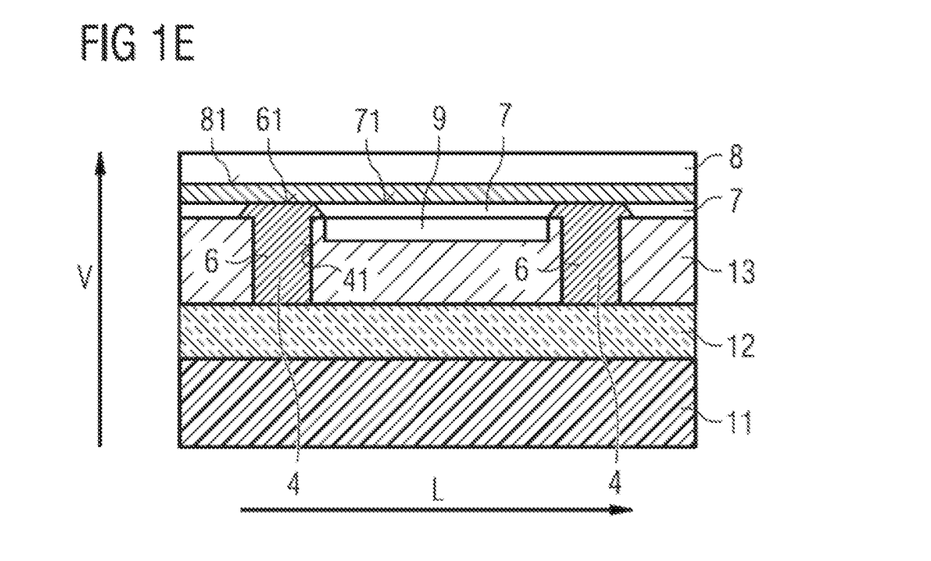

The schematic side view in FIG. 1E illustrates, in a next step, how a semiconductor body 8 is applied on the outer surface 71 of the polishing stop layer 7 and the outer surfaces 61 of the electrically conductive material 6, wherein the semiconductor body 8 comprises at least one active zone 81 suitable for generating electromagnetic radiation. By way of example, the semiconductor body 8 is based on a III nitride semiconductor material. The semiconductor body 8 is electrically conductively connected to the electrically conductive material 6. For this purpose, the semiconductor body 8 can have contact locations which bear on the outer surfaces 61 of the electrically conductive material 6 and are in direct contact for example with them. In particular, the protective diode structure 9 can be electrically interconnected with the semiconductor body 8, as a result of which the semiconductor body 8 is protected against electrostatic discharge.

Figure 1F:
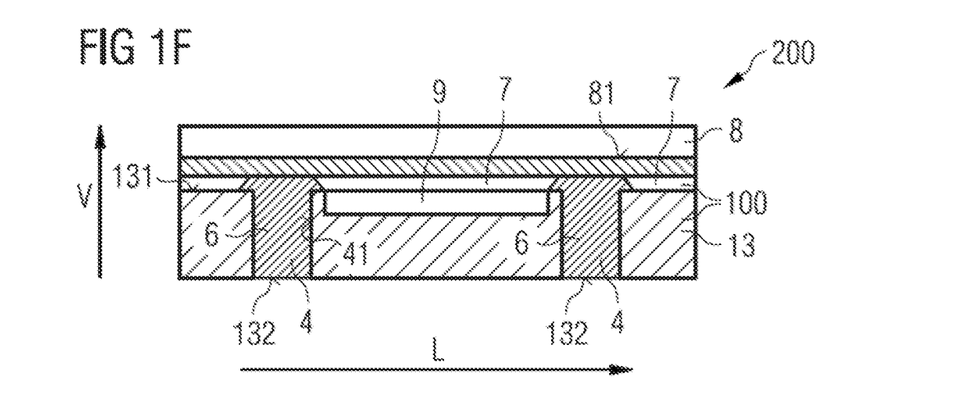

The schematic side view in FIG. 1F illustrates that both the support body 11 and the intermediate layer 12 have been completely removed from the utility layer 13 and, after the removal of the support body 11 and the intermediate layer 12, an optoelectronic semiconductor component 200 comprising an electrical terminal support 100 has been produced. By way of example, the removal can take place by means of the action of high-energy laser light on the intermediate layer 12, which is at least partly destroyed on account of the laser light. By way of example, residues of the intermediate layer 12 that still remain can be removed from the utility layer 13 by means of at least one chemical and/or mechanical polishing step. The optoelectronic semiconductor component 200 has a contact surface 132 situated opposite the outer surface 131. In the present case, the contact surface 132 is formed in places by outer surfaces of the electrically conductive material 6. The openings 4 extend completely through the utility layer 13 proceeding from the outer surface 131 in the direction of the contact surface 132.

Figure 2A:
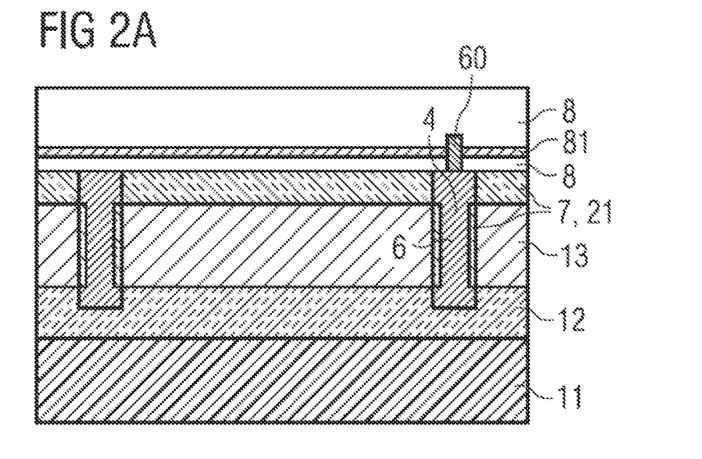
FIGS. 2A, 2B and 2C schematically show individual manufacturing processes for producing an exemplary embodiment of an optoelectronic semiconductor component described here.

The schematic side view in FIG. 2A illustrates a preliminary stage of an optoelectronic semiconductor component 200 described here. The support arrangement 1 has, inter alia, the openings 4 arranged in a manner spaced apart from one another in a lateral direction, said openings partly projecting into the intermediate layer 12, wherein the openings 4 are filled with the electrically conductive material 6. The optoelectronic semiconductor body 8 is arranged on the outer surface of the utility layer 131 facing away from the support body 11, wherein the active zone 81 of the optoelectronic semiconductor body 8 is penetrated by the electrically conductive material 6 and the electrically conductive material 6 is conductively connected to a doped region of the optoelectronic semiconductor body 8.

Figure 2B:
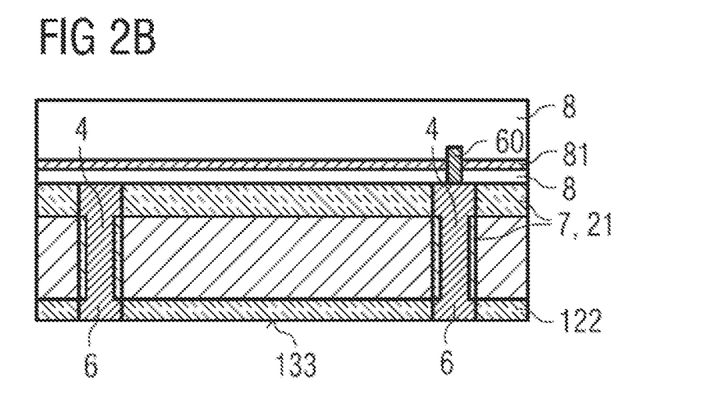
Figure 2C:
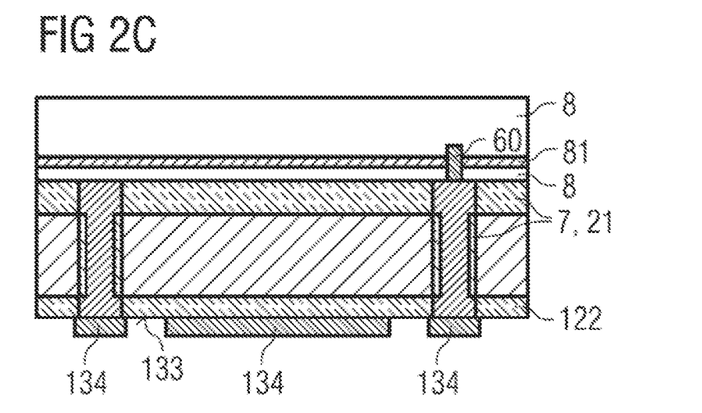

The schematic side view in FIGS. 2B and 2C illustrates that the support body 11 in its entirety and the intermediate layer 12 at least in part are removed from the utility layer 13; in this case, the electrically conductive material 6 forms an interface with the intermediate layer 12 still partly present. The interface composed of the intermediate layer 12 and electrically conductive material 6 then forms the terminal area 133, which can serve for example for connection to a component support. The terminal area is formed with electrically conducive material, e.g. solder.

Figure 3A:
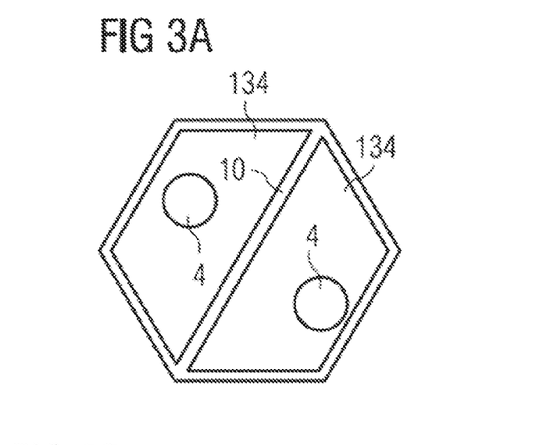
FIGS. 3A and 3B schematically show possible exemplary embodiments of the contact layer described here.
Figure 3B:
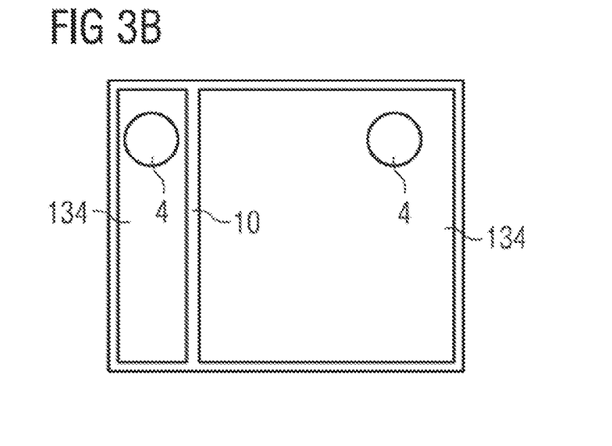

The schematic plan view in FIGS. 3A and 3B in each case illustrates exemplary embodiments of a contact layer 134 formed on a terminal area 133 (see FIG. 2C). The terminal area 133 is an interface, wherein the interface is formed from the electrically conductive material 6 and the intermediate layer 122. As can be seen from the two exemplary embodiments, the contact layer 134 can be embodied in a hexagonal or rectangular fashion—just like the component—, wherein the contact layer 134 can be embodied symmetrically and/or asymmetrically. In this case, the contact layer 134, in the region of the openings 4 with the electrically conductive material 6, is separated from one another in particular by an insulation gap 10. The insulation gap 10 can consist of an insulating material and separates the contact layer 134 in such a way that the contact layer has regions and/or areas which are electrically insulating with respect to one another.

Figure 4:
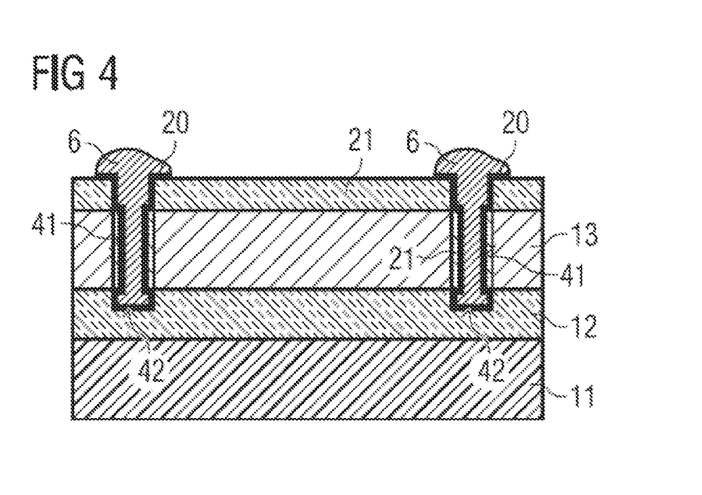
FIG. 4 schematically shows an exemplary embodiment for coating the insulation layer in the region of the openings with a metal layer for improving the wetting by the electrically conductive material.

The schematic side view in FIG. 4 illustrates, in the exemplary embodiment, the coating of the insulation layer 21 with an additional metal layer 20. The coating by the metal layer 20 is effected in the region of the openings 4, in particular at the side surfaces 41 and the bottom surface of the openings 42 and on the outer surface of the utility layer 131 facing away from the support body 11 in the edge region of the openings, wherein the metal layer is embodied in a ring-shaped fashion in a plan view.

The invention is not restricted by the description on the basis of the exemplary embodiments. Moreover, the invention encompasses any novel feature and also any combination of features, which in particular includes any combination of features in the patent claims, even if this feature or this combination itself is not explicitly specified in the patent claims or the exemplary embodiments.

This patent application claims the priority of German patent application 102010056056.1, the disclosure content of which is hereby incorporated by reference.

The invention claimed is:

1. A method for producing an electrical terminal support for an optoelectronic semiconductor body comprising the following steps:
   providing a support arrangement having a support body, an intermediate layer arranged on an outer surface of the support body, and a self-supporting utility layer arranged on an outer surface of the intermediate layer facing away from the support body, wherein the utility layer is formed with at least one of the materials Si, AlN, GaN, Ge, GaAs or contains at least one of the materials;
   introducing at least two openings arranged in a manner spaced apart from one another in a lateral direction into the utility layer via an outer surface of the utility layer facing away from the support body, wherein the openings extend completely through the utility layer in a vertical direction;
   electrically insulating side surfaces of the openings and the outer surface of the utility layer facing away from the support body by an oxidation method, such that the material of the utility layer is surface-oxidized;
   arranging electrically conductive material at least in places in the openings;
   arranging at least one protective diode structure in the utility layer, wherein the protective diode structure is electrically interconnected with the semiconductor body; and
   after arranging the electrically conductive material, removing the support body and the intermediate layer, wherein the protective diode structure is integrated in the utility layer and does not project from the utility layer in a vertical direction facing away from the support body, wherein after the terminal support has been completed, the electrically conductive material has at least one interruption in its course along the outer surface of the utility layer in the lateral direction between adjacent openings.

2. The method according to claim 1, wherein the support body is formed with a silicon and the intermediate layer is formed with an oxide of the silicon or a nitride of the silicon.

3. The method according to claim 1, wherein the utility layer is formed with at least one of the materials or contains at least one of the materials: Si, N, GaN, Ge, GaAs.

4. The method according to claim 1, wherein the process of electrically insulating is carried out by means of at least one thermal oxidation method.

5. The method according to claim 1, wherein the electrically conductive material is introduced in the form of a melt into the openings and subsequently cures, and
wherein the electrically conductive material is formed with at least one of the following materials or contains at least one of the following materials: Al, Zn, Cu, Ag, Si, Cd, Ga, In, Tl, Sn, Pb, Bi, Po or the electrically conductive material comprises at least one binary eutectic system.

6. The method according to claim 5, wherein, after curing, the electrically conductive material projects beyond the utility layer in a vertical direction.

7. The method according to claim 1, wherein at least one polishing stop layer is applied at least in places to the outer surface of the utility layer facing away from the support body, and
wherein outer surfaces of the electrically conductive material facing away from the support body are free of the polishing stop layer at least in places and the polishing stop layer is formed with at least one of the following materials or contains at least one of the following materials: $SiO_2$, $Si_3N_4$, SrO, HfO, $HfO_2$, ZrO, $ZrO_2$.

8. The method according to claim 7, wherein, after applying at least one polishing step at least to the electrically conductive material, the electrically conductive material does not project beyond the polishing stop layer in a vertical direction.

9. The method according to claim 1, wherein, after arranging the electrically conductive material, the support body is removed from the intermediate layer.

10. A method for producing an optoelectronic semiconductor component comprising the following steps:
providing an electrical terminal support produced by a method according to claim 1; and
arranging at least one optoelectronic semiconductor body on the outer surface of the utility layer, wherein the optoelectronic semiconductor body comprises at least one active zone suitable for generating or for detecting electromagnetic radiation, and is electrically conductively connected to the electrically conductive material.

11. The method according to claim 10, wherein a further electrically conductive material penetrates through the active zone of the optoelectronic semiconductor body and a doped region of the optoelectronic semiconductor body is electrically conductively connected to the electrically conductive material of the electrical terminal support.

12. The method according to claim 1, wherein the process of electrically insulating side surfaces of the openings and the outer surface of the utility layer is carried out by heating, such that the material of the utility layer is surface-oxidized.

* * * * *